(12) United States Patent
Koh

(10) Patent No.: US 7,095,086 B2
(45) Date of Patent: Aug. 22, 2006

(54) SEMICONDUCTOR DEVICES AND METHODS OF MANUFACTURING THE SAME

(75) Inventor: Kwan-Ju Koh, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/027,044

(22) Filed: Dec. 30, 2004

(65) Prior Publication Data
US 2005/0139912 A1 Jun. 30, 2005

(30) Foreign Application Priority Data
Dec. 31, 2003 (KR) .................. 10-2003-0101925
Dec. 31, 2003 (KR) .................. 10-2003-0101927

(51) Int. Cl.
*H01L 21/84* (2006.01)
(52) U.S. Cl. ............... 257/408; 438/163; 257/E21.437
(58) Field of Classification Search .............. 257/408
See application file for complete search history.

(56) References Cited

U.S. PATENT DOCUMENTS

| 5,682,055 A | * | 10/1997 | Huang et al. | ............ 257/408 |
| 5,683,924 A | | 11/1997 | Chan et al. | |
| 5,828,103 A | * | 10/1998 | Hsu | ............ 257/344 |
| 5,920,104 A | * | 7/1999 | Nayak et al. | ............ 257/408 |
| 6,359,310 B1 | * | 3/2002 | Gonzalez et al. | ............ 257/344 |
| 6,562,687 B1 | * | 5/2003 | Deleonibus et al. | ........ 438/303 |

* cited by examiner

*Primary Examiner*—Evan Pert
*Assistant Examiner*—Benjamin P. Sandvik
(74) *Attorney, Agent, or Firm*—Andrew D. Fortney

(57) ABSTRACT

Semiconductor devices and methods of manufacturing the same are provided. A disclosed semiconductor device includes: a semiconductor substrate; a gate insulating layer on the active region of the semiconductor substrate; a gate on the gate insulating layer; LDD regions on opposite sides of the gate insulating layer and located in the semiconductor substrate; source/drain regions on the LDD regions; and silicide layers on the surfaces of the gate and the source/drain regions. The source/drain regions are formed by doping impurities in a silicon layer grown by a selective epitaxy.

20 Claims, 13 Drawing Sheets

SEMICONDUCTOR DEVICES AND METHODS OF MANUFACTURING THE SAME

FIELD OF THE DISCLOSURE

The present disclosure relates generally to semiconductor devices and, more particularly, to transistors of semiconductor devices and methods of manufacturing the same.

BACKGROUND

As the degree of integration of semiconductor devices has increased, implanting ions by low energy, double ion implantation, and controlling the channeling effect by pre-amorphousness have been proposed for forming shallow source/drain junctions on a transistor. To apply such methods to forming shallow junctions under 0.1 µm, more research with regard to the physical and chemical characteristics of defects formed by ion implantation is needed.

Accordingly, instead of the conventional method of forming a source/drain junction in a semiconductor substrate, elevated source/drain junctions which are formed in an epitaxy layer grown on the surface of a semiconductor substrate have recently been proposed.

Figure 1:
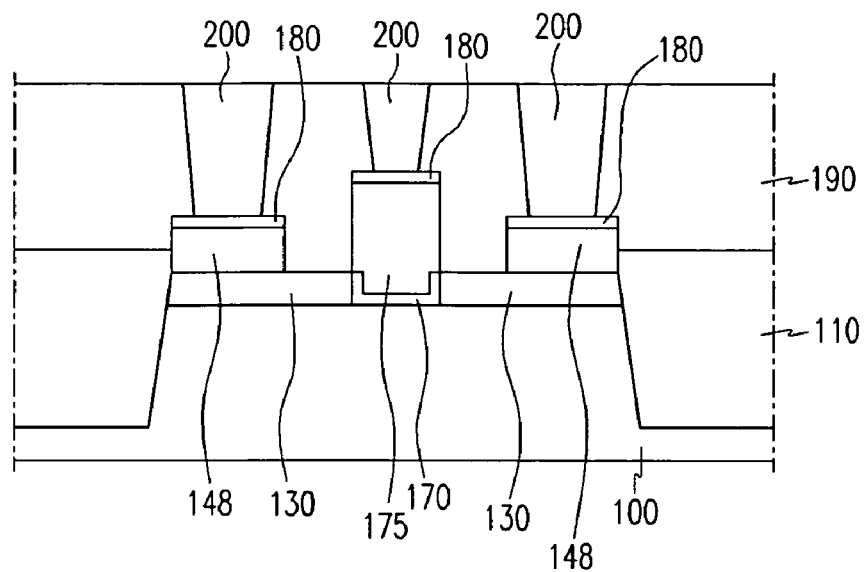
FIG. 1 is a cross-sectional view of an example semiconductor device constructed in accordance with the teachings of the present invention.

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

An example semiconductor device constructed in accordance with the teachings of the present invention will now be described in detail with reference to accompanying drawings. FIG. 1 is a cross-sectional view of a transistor of the example semiconductor device.

In the example of FIG. 1, the semiconductor device includes a gate insulating layer 170 formed on a semiconductor substrate 100. The gate insulating layer 170 is on an active region separated from other active regions by device isolation layers 110. In the illustrated example, the gate insulating layer 170 is made of an oxide and has a thickness of about 50–200 Å.

A gate 175, which in the illustrated example is made of polysilicon, is formed on the gate insulating layer 170. LDD regions 130 (i.e., lightly doped regions with impurities) are formed on opposite sides of the gate insulating layer 170. The LDD regions 130 are located below the surface of the semiconductor substrate 100.

Source/drain regions 148, which are heavily doped with impurities, are formed on the LDD regions 130. The source/drain regions 148 of the illustrated example are made of a silicon layer grown by selective epitaxy. In the example of FIG. 1, the source/drain regions 148 have a thickness of about 1000~3000 Å above the surface of the semiconductor substrate 100. Accordingly, since the heights of the source/drain regions 148 are similar to the height of the gate 175, a large margin is provided for subsequent etching process(es) to form contact holes exposing the gate 175 and the source/drain regions 148.

Silicide films 180 are respectively formed on the upper surfaces of the gate 175 and the source/drain regions 148. The silicide films 180 reduce the sheet resistances and the contact resistances of the gate 175 and the source/drain regions 148.

An interlayer insulating layer 190 having contact holes (not shown in FIG. 1) which expose portions of the silicide films 180 is formed on the silicide films 180 and the semiconductor substrate 100. Conductive plugs 200 made of a conductive material such as tungsten are formed to fill the contact holes.

An example process for manufacturing the example semiconductor device of FIG. 1 will now be described in detail with reference to accompanying drawings. FIG. 2A to FIG. 2M are cross-sectional views illustrating sequential points in the performance of that process.

Figure 2A:
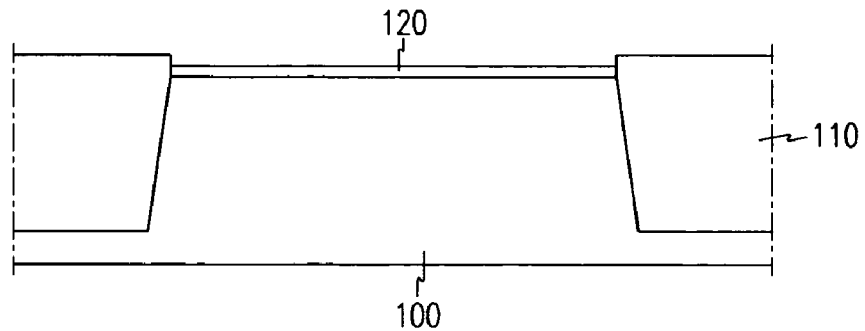
FIG. 2A to FIG. 2M are cross-sectional views illustrating an example process for manufacturing a semiconductor device performed in accordance with the teachings of the present invention.

In the example of FIG. 2A, an ion implant buffer film 120 is formed on a semiconductor substrate 100. Device isolation layers 110 isolating an active area are formed in the substrate 100 by oxidation.

Figure 2B:
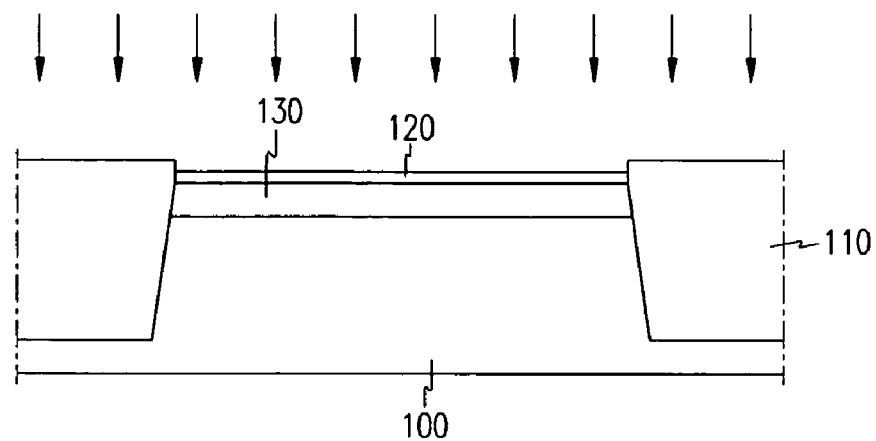

Subsequently, as shown in FIG. 2B, an LDD region 130 is formed in the semiconductor substrate 100 by lightly doping impurities. During this process, the ion implant buffer film 120 prevents the semiconductor substrate 100 from being damaged by the ion implantation.

Figure 2C:
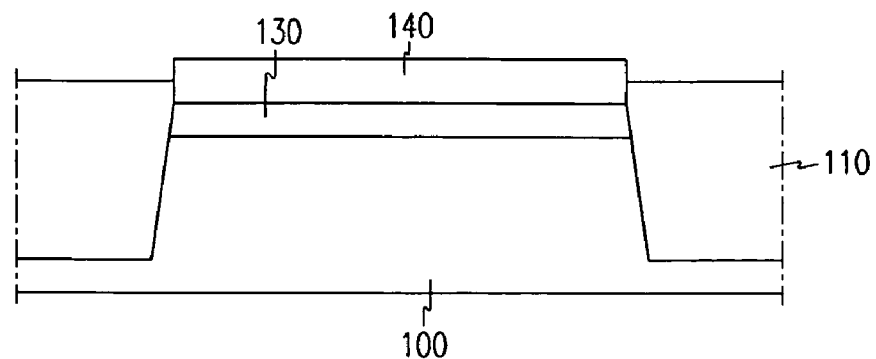

As shown in FIG. 2C, after removing the ion implant buffer film 120, a silicon layer 140 is grown on the exposed semiconductor substrate 100 by selective epitaxy. In the illustrated example, the silicon layer 140 preferably has a thickness of about 1000~3000 Å to reduce the height-difference between the source/drain regions and the gate 175 which will be described later.

Figure 2D:
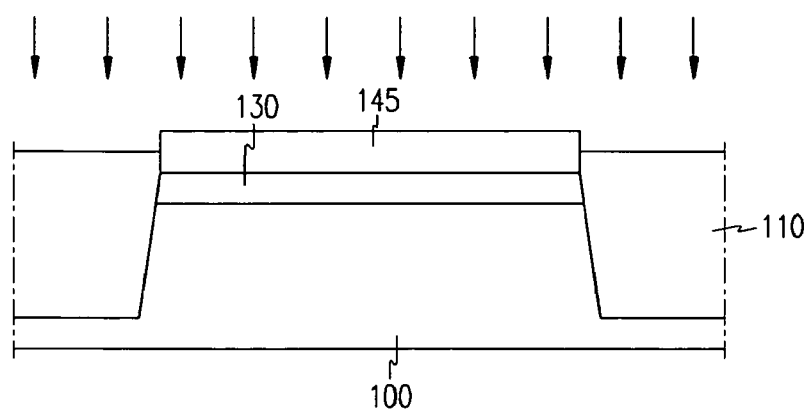

As shown in FIG. 2D, a heavily doped layer 145 is formed by heavily doping impurities on the silicon layer 140.

Figure 2E:
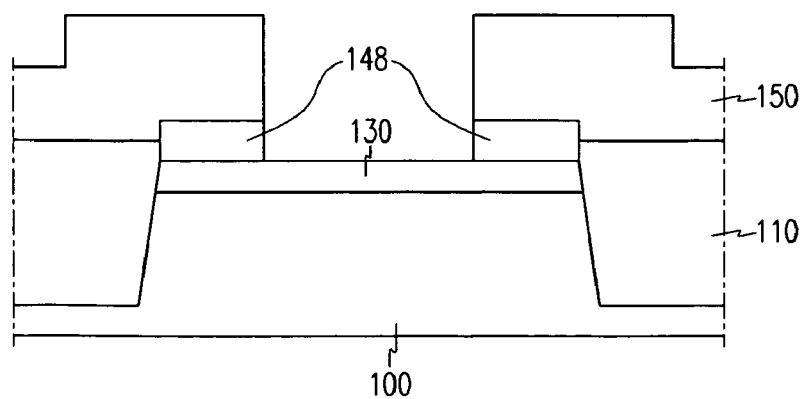

Subsequently, as shown in FIG. 2E, a nitride film 150 having a cutout wider than a gate forming region is formed on the semiconductor substrate 100 and the heavily doped layer 145. Next, the heavily doped layer 145 is etched using the nitride film 150 as an etch mask to form source/drain regions 148. In the illustrated example, the nitride film 150 has a thickness of about 1000~2000 Å.

Figure 2F:
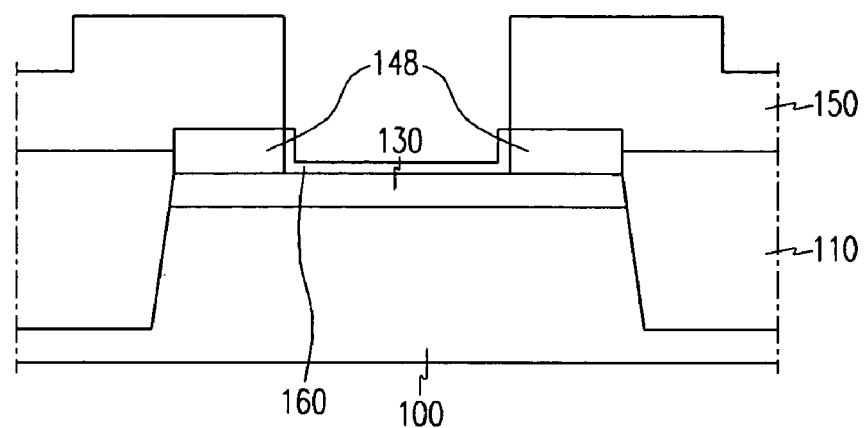

In the example of FIG. 2F, a silicide preventing film 160 made of an oxide is formed on the semiconductor substrate 100 by oxidation. In this oxidation, the nitride film 150 is used as an oxidation hinder. The silicide preventing film 160 preferably has a thickness of about 50~200 Å.

Figure 2G:
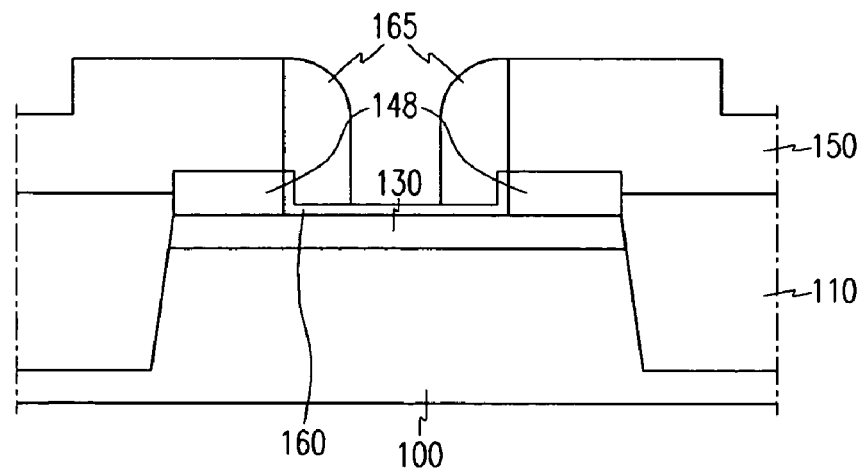

Referring to FIG. 2G, a second nitride film (not shown) is deposited on the entire surface of the semiconductor substrate 100 including the silicide preventing film 160. The second nitride film is etched to form lateral spacers 165 which are disposed in the cutout of the first nitride film 150 in contact with the lateral sides of the first nitride film 150. The width of lateral spacers 165 can be adjusted according to the width of the gate 175.

Figure 2H:
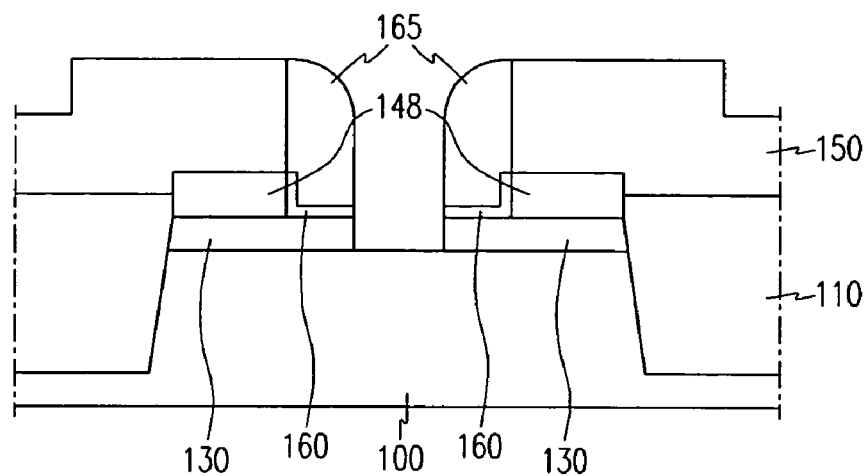

As shown in FIG. 2H, portions of the silicide preventing film 160 and the semiconductor substrate 100 are etched back by using the lateral spacers 165 as an etch mask. The semiconductor substrate 100 is preferably etched to remove the entire depth of the LDD region 130. As a result, a portion between the separated LDD regions 130 of the semiconductor substrate 100 is exposed to the atmosphere.

Figure 2I:
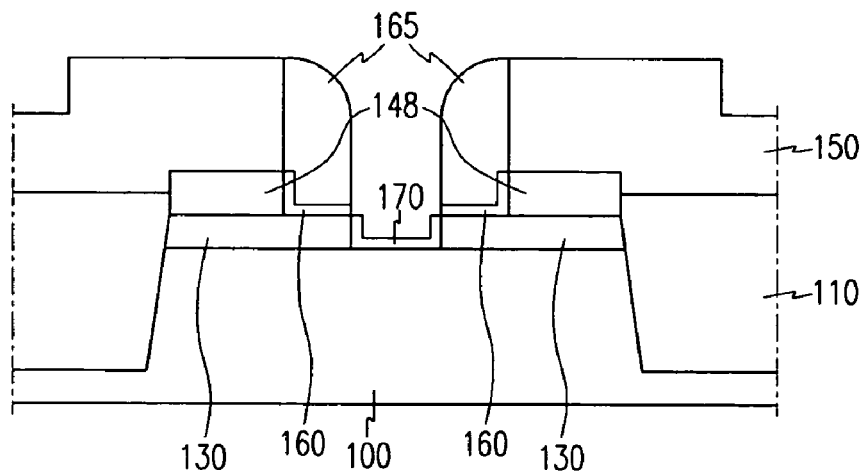

Next, as shown in FIG. 2I, the gate oxide layer 170 is formed on the gate forming region (i.e., on the portion of the semiconductor substrate 100 exposed to the atmosphere) by oxidation. The thickness of the gate oxide layer 170 can be adjusted according to the width and the use of the gate 175.

Figure 2J:
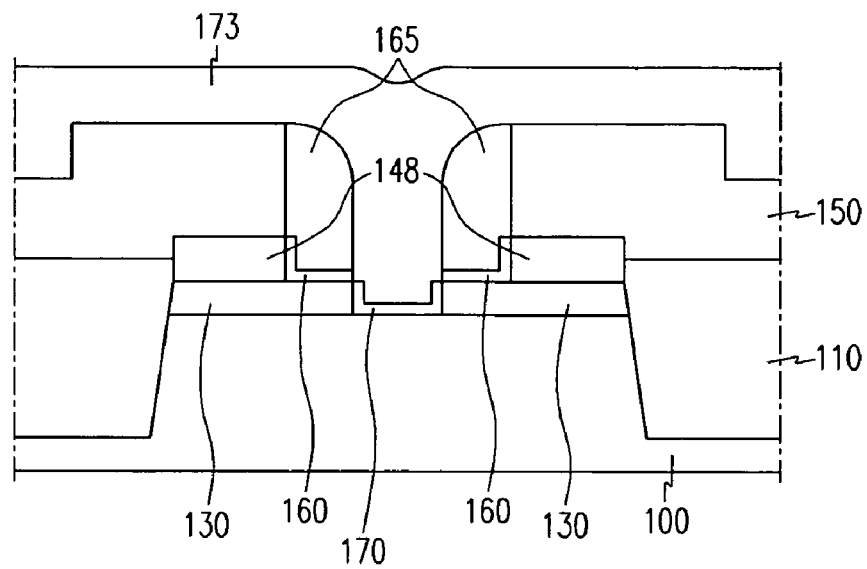

As shown in FIG. 2J, a polysilicon layer 173 is formed on the gate oxide layer 170. Here, the polysilicon layer 173 is formed to have enough thickness to fully cover the nitride film 150.

Figure 2K:
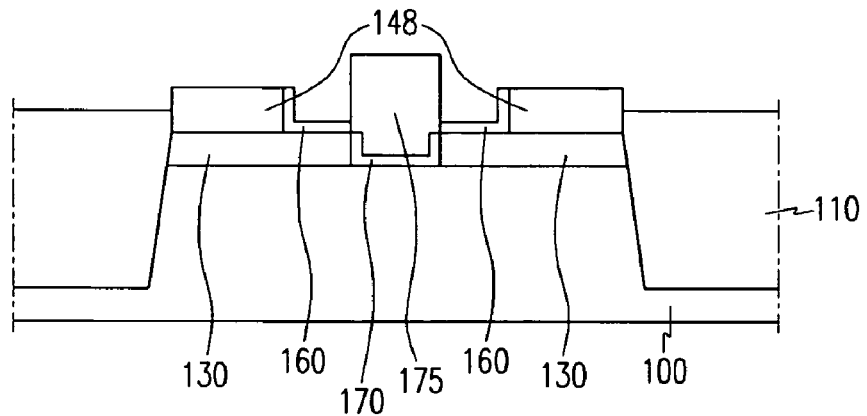

Next, the polysilicon layer 173 is etched back to remove the portions of the layer 173 outside the gate forming region. Next, as shown in FIG. 2K, the nitride film 150 and the lateral spacers 165 are removed to form a gate 175 made of polysilicon.

Figure 2L:
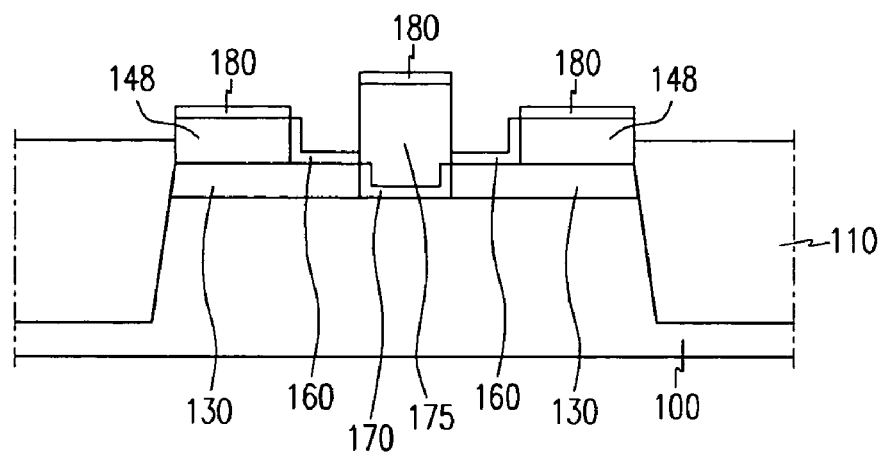

As shown in FIG. 2l, the semiconductor substrate 100 is subsequently annealed after a silicide forming layer of metal atoms of 8 group (e.g., Ni, Co, Pt, etc.) or titanium (Ti) is formed on the gate 175 and the source/drain regions 148. In the illustrated example, the silicide films 180 are formed on the upper surfaces of the gate 175 and the source/drain regions 148, which are not covered with the silicide preventing film 160.

Figure 2M:
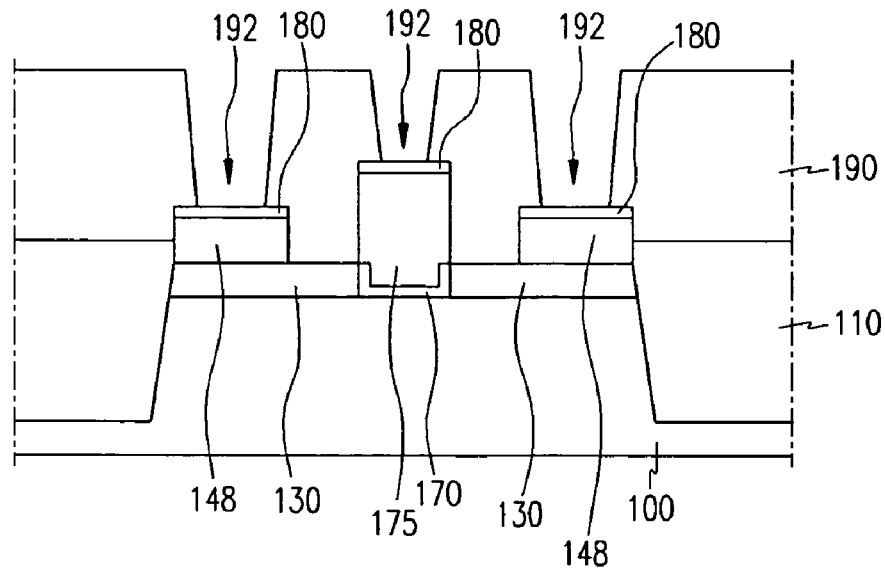

Referring to FIG. 2M, an insulating material such as oxide or nitride is deposited on the silicide films 180 to form an intermediate insulating layer 190. The intermediate insulating layer 190 is selectively etched to form contact holes 192, 194, and 196 exposing the silicide films 180 on the gate 175 and the source/drain regions 148. Since the height difference between the gate 175 and the source/drain regions 148 is small, a large margin is allowed for the etching process to form contact holes 192, 194, and 196.

The contact holes 192, 194, and 196 can be easily formed because of the heights of the gate 175 and the source/drain regions 148 relative to the semiconductor substrate 100 and because the contact holes 192, 194, and 196 are completed by a small amount of etching of the interlayer insulating layer 190. Furthermore, since this structure allows direct contact of the gate 175 and the source/drain regions 148 via the contact holes 192, 194, and 196, the contact resistance is reduced and the response speed of the semiconductor device is simultaneously increased. As a result, the short-channel effect can be obtained while a channel is formed.

Next, as shown in FIG. 1, conductive plugs 200 are formed by filling the contact holes with a conducting material such as tungsten.

Figure 3:
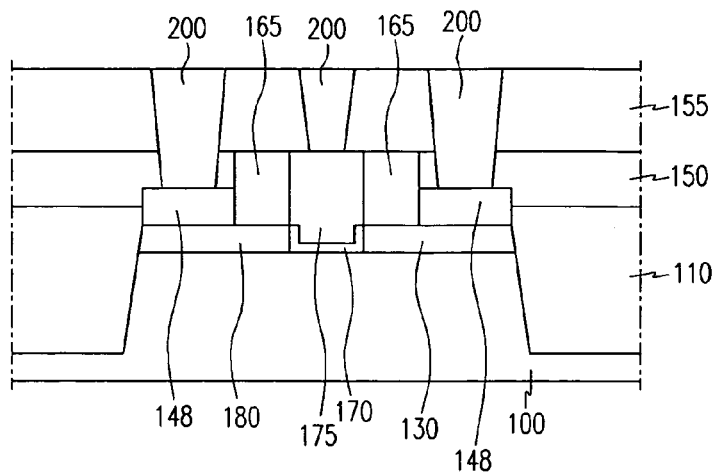
FIG. 3 is a cross-sectional view of another example semiconductor device constructed in accordance with the teachings of the present invention.

FIG. 3 is a cross-sectional view of another example transistor constructed in accordance with the teachings of the present invention. In the example of FIG. 3, the semiconductor device includes a gate insulating layer 170 formed on a semiconductor substrate 100. The gate insulating layer 170 is located on an active region separated from other active regions by device isolation layers 110. In the illustrated example, the gate insulating layer 170 is made of an oxide and has a thickness of about 50~200 Å.

A gate 175 made of polysilicon is formed on the gate insulating layer 170. LDD regions 130 (i.e., regions which are lightly doped with impurities) are formed on opposite sides of the gate insulating layer 170. The LDD regions 130 are located below the surface of the semiconductor substrate 100.

The source/drain regions 148 (which are heavily doped with impurities) are formed on the LDD regions 130. The source/drain regions 148 are made of a silicon layer grown by selective epitaxy. The source/drain regions 148 are silicon layers 148 having a thickness of about 1000~3000 Å above the surface of the semiconductor substrate 100. Accordingly, since the heights of the source/drain regions 148 are similar to the height of the gate 175, a large margin is provided for the etching process to form the contact holes exposing the gate 175 and the source/drain regions 148.

An interlayer insulating layer 155 having contact holes (not shown in FIG. 3) which expose the gate 175 and the source/drain region 148 is formed on the semiconductor substrate 100 having the gate 175 and the source/drain region 148. Conductive plugs 200 made of a conductive material such as tungsten are formed to fill the contact holes.

An example process for manufacturing the semiconductor device of FIG. 3 will now be described in detail with reference to accompanying drawings. FIG. 4a to FIG. 4k are cross-sectional views sequentially illustrating the example manufacturing process.

Figure 4A:
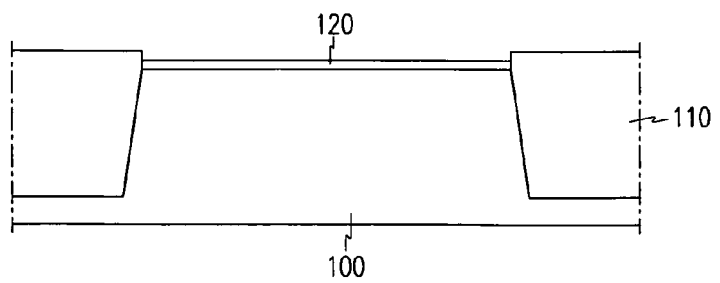
FIG. 4A to FIG. 4K are cross-sectional views illustrating another example process for manufacturing a semiconductor device performed in accordance with the teachings of the present invention.

As shown in FIG. 4A, an ion implant buffer film 120 is formed on a semiconductor substrate 100. The substrate 100 includes device isolation layers 110 isolating an active area by oxidation.

Figure 4B:
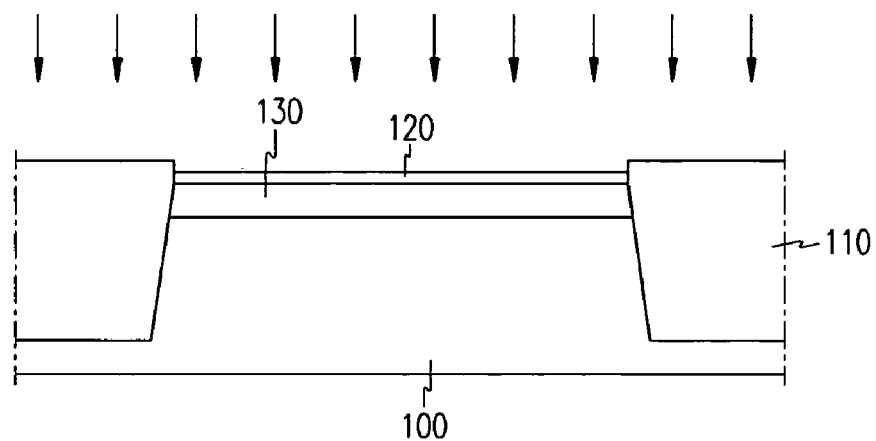

Subsequently, as shown in FIG. 4B, an LDD region 130 is formed in the semiconductor substrate 100 by lightly doping impurities. The ion implant buffer film 120 prevents the semiconductor substrate 100 from suffering damage during this ion implantation.

Figure 4C:
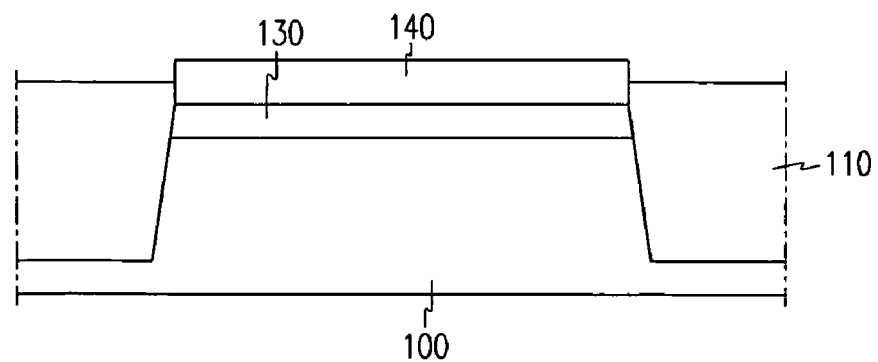

As shown in FIG. 4C, after removing the ion implant buffer film 120, a silicon layer 140 is grown on the exposed semiconductor substrate 100 by selective epitaxy. In the illustrated example, the silicon layer 140 preferably has a thickness of about 1000~3000 Å to reduce the height-difference between the source/drain regions 148 and the gate 175 which will be described later.

Figure 4D:
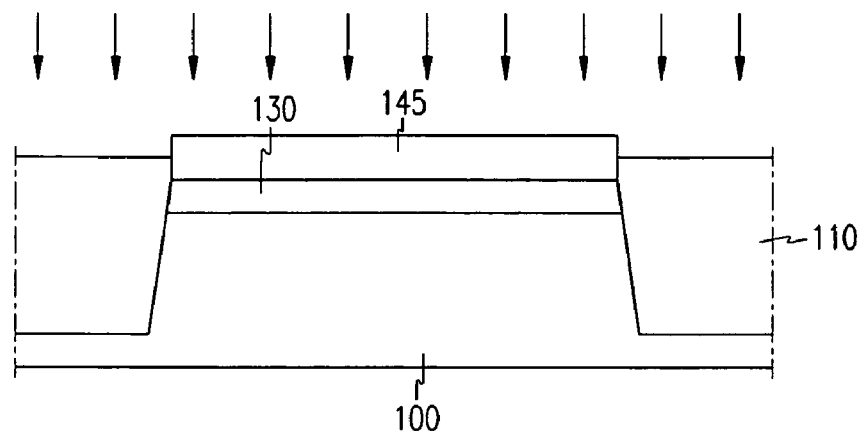

As shown in FIG. 4D, a heavily doped layer 145 is formed by heavily doping impurities in the silicon layer 140.

Figure 4E:
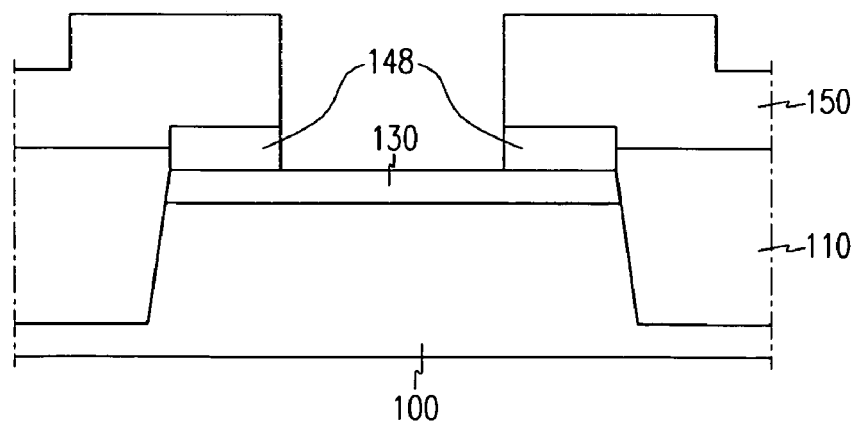
Figure 4F:
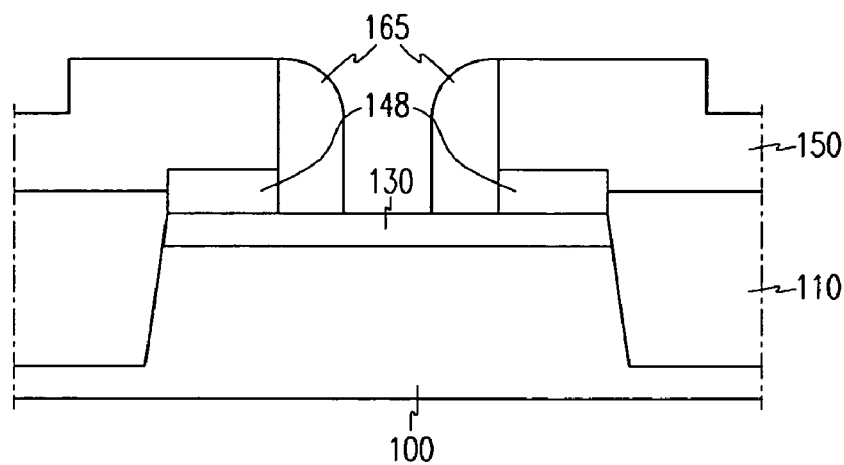

Subsequently, as shown in FIG. 4E, a nitride film 150 having a cutout wider than a gate forming region is formed on the semiconductor substrate 100 and the heavily doped layer 145. Next, the heavily doped layer 145 is etched to form the source/drain regions 148 by using the nitride film 150 as an etch mask. In the illustrated example, the nitride film 150 has a thickness of about 1000~2000 Å.

A nitride film (not shown) is deposited on the entire surface of the semiconductor substrate 100 including the nitride film 150. The nitride film is etched to form lateral spacers 165 which are disposed in contact with the lateral sides of the nitride film 150. The width of the lateral spacers 165 can be adjusted according to the desired width of the gate 175.

Figure 4G:
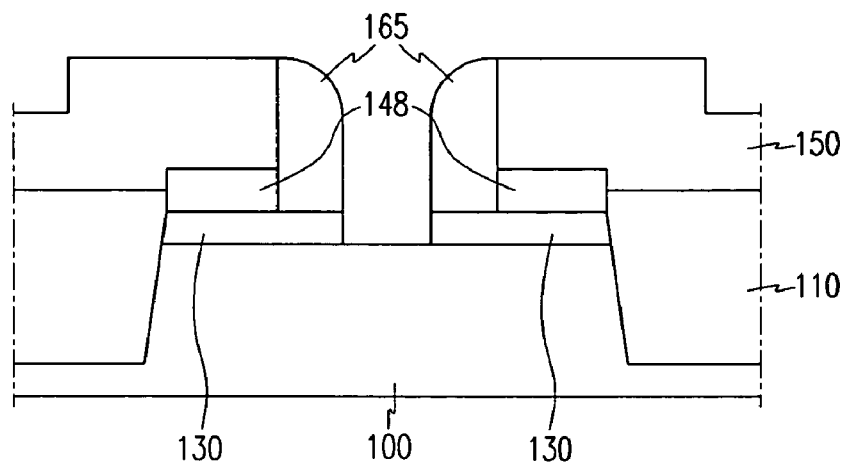

As shown in FIG. 4G, a portion of the semiconductor substrate 100 is etched back by using the lateral spacers 165 as an etch mask. In the illustrated example, the semiconductor substrate 100 is preferably etched to remove the entire depth of the LDD region 130. As a result, a portion of the semiconductor substrate 100 between the separated LDD regions 130 is exposed to the atmosphere.

Figure 4H:
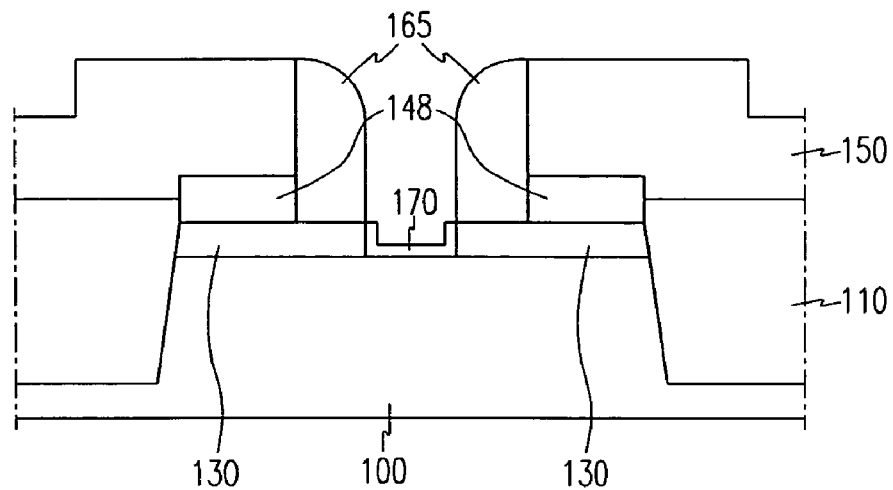

Next, as shown in FIG. 4H, the gate oxide layer 170 is formed on the gate forming region (i.e., on the portion of the semiconductor substrate 100 exposed to the atmosphere) by oxidation. In the illustrated example, the thickness of the gate oxide layer 170 can be adjusted according to the width and the use of the gate 175.

Figure 4I:
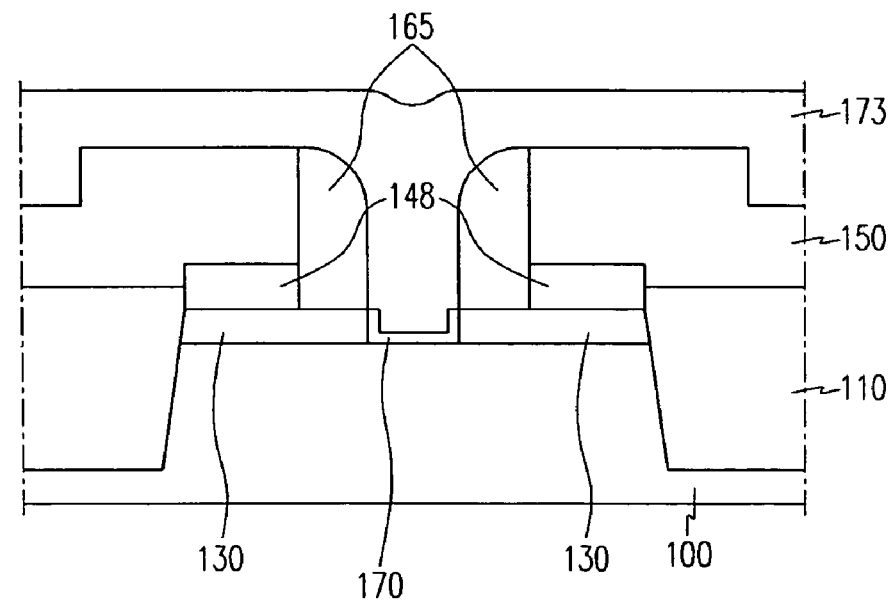

As shown in FIG. 4I, a polysilicon layer 173 is formed on the gate oxide layer 170. In the illustrated example, the polysilicon layer 173 is formed to have enough thickness to fully cover the nitride film 150.

Figure 4J:
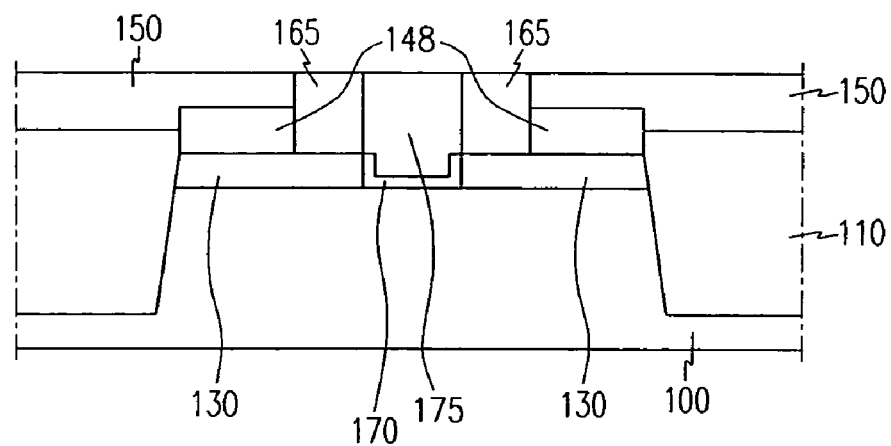

As shown in FIG. 4J, a gate 175 made of polysilicon is formed on the gate forming region by chemical-mechanical polishing of the polysilicon layer 173. In the illustrated example, the chemical-mechanical polishing is performed until the nitride film 150 is exposed and etched a little.

Figure 4K:
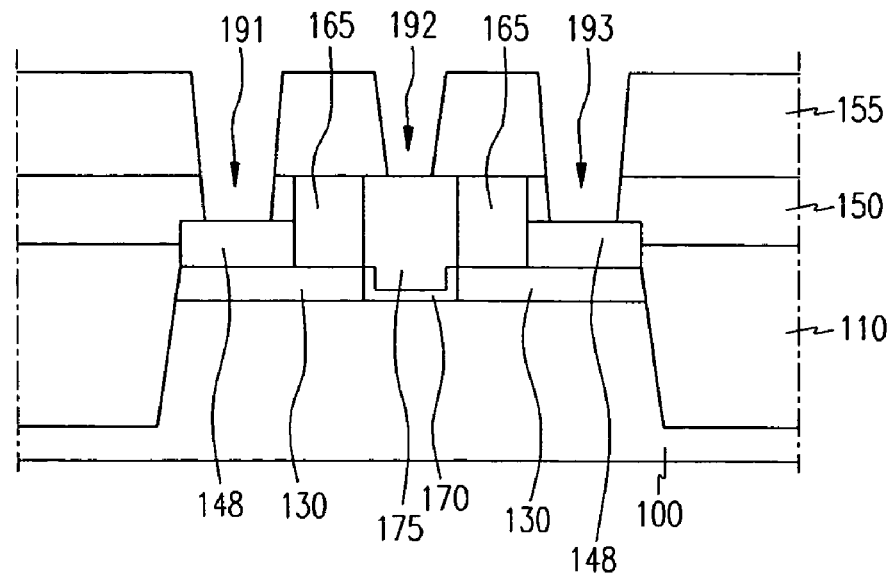

Subsequently, as shown in FIG. 4K, an interlayer insulating layer 155 is formed on the semiconductor substrate 100 and the gate 175. The thickness of the interlayer insulating layer 155 can be adjusted according to the use of the device. The nitride film 150 and the interlayer insulating layer 155 are selectively etched to form contact holes 191, 192, and 193 exposing the gate 175 and the source/drain regions 148 as shown in FIG. 4K. Since the height difference between the gate 175 and the source/drain regions 148 is small, a large margin is provided for the etching process to form contact holes 191, 192, and 193 and a uniform profile of the contact holes 191, 192, and 193 is obtained. The contact holes 191, 192, and 193 can be easily formed because the gate 175 and the source/drain regions 148 are disposed above the semiconductor substrate 100 and the contact holes 191, 192, and 193 are completed by a small amount of etching of the interlayer insulating layer 190. Furthermore, since this structure allows direct contact with the gate 175 and the source/drain regions 148 through the contact holes 191, 192, and 193, contact resistance is reduced and the response speed of the fabricated device is simultaneously increased.

As shown in FIG. 3, conductive plugs 200 made of a conductive material such as tungsten are formed to fill the contact holes 191, 192, and 193.

From the foregoing, persons of ordinary skill in the art will readily appreciate that, since the gate and the source/drain regions may be directly contacted through the contact holes, the contact resistance is reduced and the response speed of the fabricated device is simultaneously increased. Accordingly, a short-channel effect is obtained.

Furthermore, since the height difference between the gate 175 and the source/drain regions 148 is reduced by forming the source/drain regions 148 of an epitaxy layer, a large margin is provided for the etching process to form the contact holes.

Persons of ordinary skill in the art will, thus, appreciate that the above disclosed methods decrease the contact resistances and improve the response characteristics of a semiconductor device by enabling direct contact with the gate 175 and the source/drain regions 148 through contacts located in contact holes.

Persons of ordinary skill in the art will further appreciate that an example semiconductor device has been disclosed which includes: a semiconductor substrate including device isolation regions and an active region; a gate insulating layer formed on the active region of the semiconductor substrate; a gate formed on the gate insulating layer; LDD regions formed on opposite sides of the gate insulating layer and located in the semiconductor substrate; source/drain regions formed on the LDD regions; and silicide layers formed on the surfaces of the gate and the source/drain regions. The source/drain regions are formed by doping impurities in a silicon layer grown by a selective epitaxy.

The illustrated source/drain regions are preferably formed above the surface of the substrate.

Persons of ordinary skill in the art will further appreciate that an example manufacturing method has been disclosed which comprises: forming an ion implant buffer film on a semiconductor substrate having an active region; forming an LDD region by doping impurities on the semiconductor substrate; growing a silicon layer by selective epitaxy after removing the ion implant buffer film; forming a heavily doped layer by doping ion impurities on the silicon layer; forming a nitride film having a cutout wider than a gate forming region on the heavily doped layer; etching the heavily doped layer to form source/drain regions by using the nitride film as an etch mask; forming a silicide preventing film on an upper surface of the LDD region and on lateral sides of the source/drain regions; forming lateral spacers adjacent the nitride film and on the silicide preventing film; etching the silicide preventing film and the LDD region to expose the surface of substrate by using the lateral spacers as an etch mask; forming a gate oxide layer on the exposed portion of the substrate; forming a gate on the gate oxide layer; removing the lateral spacers and the nitride film; and forming silicide layers on the upper surfaces of the gate and the source/drain regions.

Forming a gate on the gate oxide layer may comprise: forming a polysilicon layer on the substrate and the gate oxide layer; and etching the polysilicon layer to remove the portion of the polysilicon layer formed outside of the gate forming region.

The insulating layer may be formed to have a thickness of about 1000~2000 Å. The silicon layer may be grown to have a thickness of about 1000~3000 Å. The gate oxide layer may be formed to have a thickness of about 50~200 Å by oxidation of the substrate.

After forming the silicide layer on the upper surfaces of the gate and the source/drain regions, an interlayer insulating layer having contact holes exposing portions of the silicide layer may be formed on the substrate. Conductive plugs may then be formed by filling the contact holes with conducting material.

The conductive plugs may be made of tungsten.

A disclosed example semiconductor device comprises: a semiconductor substrate including device isolation regions and an active region; a gate insulating layer on the active region of the semiconductor substrate; a gate on the gate insulating layer; LDD regions on opposite sides of the gate insulating layer and located in the semiconductor substrate; and source/drain regions on the LDD regions. The source/drain regions are formed by doping impurities in a silicon layer grown by a selective epitaxy.

The source/drain regions are preferably formed above the surface of the substrate.

Another disclosed example method of manufacturing a semiconductor device comprises: forming an ion implant buffer film on a semiconductor substrate having an active region; forming an LDD region by doping impurities on the semiconductor substrate; growing a silicon layer by selective epitaxy after removing the ion implant buffer film; forming a heavily doped layer by doping ion impurities on the silicon layer; forming a nitride film having a cutout wider than a gate forming region on the heavily doped layer; etching the heavily doped layer to form source/drain regions by using the nitride film as an etch mask; forming lateral spacers on the silicide preventing film; etching the LDD region to expose the surface of the substrate by using the lateral spacers as an etch mask; forming a gate oxide layer on the exposed portion of the substrate; forming a polysilicon layer to cover the nitride film on the gate oxide layer; forming a gate by chemical mechanical polishing of the polysilicon layer; forming an interlayer insulating layer on the gate; forming contact holes exposing portions of the upper surfaces of the gate and the source/drain regions in the interlayer insulating layer; and forming conductive plugs by filling the contact holes with conducting material.

The chemical mechanical polishing of the polysilicon layer is preferably performed until the nitride film is exposed and etched a little.

The nitride film may be formed to have a thickness of about 1000~2000 Å. The silicon layer may be grown to have a thickness of about 1000~3000 Å. The gate oxide layer may be formed to have a thickness of about 50~200 Å by oxidation of the substrate.

The conductive plugs may be made of tungsten.

It is noted that this patent claims priority from Korean Patent Application Serial Number 10-2003-0101925, which was filed on Dec. 31, 2003, and from Korean Patent Application Serial Number 10-2003-0101927, which was filed on Dec. 31, 2003, which are hereby incorporated by reference in their entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of manufacturing a semiconductor device comprising;
   forming an ion implant buffer film an a semiconductor substrate;
   doping impurities to form an LDD region on the semiconductor substrate;
   removing the ion implant buffer film;
   growing a silicon layer by selective epitaxy;
   doping ion impurities on the silicon layer to form a heavily doped layer;
   forming a nitride film having a cutout wider than a gate forming region on the heavily doped layer;
   etching the heavily doped layer using the nitride film as an etch mask to form source/drain regions;
   forming a silicide preventing film on an upper surface of the LDD region and on sides of the source/drain regions;
   forming lateral spacers within the cutout on lateral sides of the nitride film and on the silicide preventing film;
   etching the silicide preventing film and the LDD region using the lateral spacers as an etch mask to expose a surface of the substrate;
   forming a gate oxide layer on the exposed surface of the substrate;
   forming a gate on the gate oxide layer;
   removing the lateral spacers and the nitride film; and
   forming silicide layers on the gate and the source/drain regions.

2. A method as defined in claim 1, wherein forming the gate on the gate oxide layer further comprises:
   forming a polysilicon layer on the substrate; and
   etching the polysilicon layer to remove a portion of the polysilicon layer farmed outside of the gate forming region.

3. A method as defined in claim 1, wherein the nitride film has a thickness of about 1000~2000 Å.

4. A method as defined in claim 1, wherein the silicon layer has a thickness of about 1000~3000 Å.

5. A method as defined in claim 1, wherein the gate oxide layer has a thickness of about 50~200 Å and is formed by oxidation of the substrate.

6. A method as defined in claim 1, further comprising:
   after forming the suicide layers on the gate and the source/drain regions, fanning an interlayer insulating layer on the substrate, the interlayer insulating layer having contact holes exposing portions of the silicide layer; and
   forming conductive plugs by filling the contact holes with conducting material.

7. A method as defined in claim 6, wherein the conductive plugs are made of tungsten.

8. The method of claim 1, wherein said step of forming a suicide preventing film comprises oxidizing the upper surface of the LDD region the sides of the source/drain regions using the nitride film as an oxidation hinder.

9. The method of claim 1, wherein said step of forming lateral spacers comprises:
   depositing a second nitride film in the cutout; and
   etching the second nitride film to form the spacers.

10. The method of claim 1, wherein said step of forming silicide layers comprises:
    forming layers of metal atoms on the gate and the source/drain region; and
    annealing the substrate.

11. A method of manufacturing a semiconductor device comprising;
    forming an ion implant buffer film on a semiconductor substrate;
    forming an LDD region by doping impurities in the semiconductor substrate;
    removing the ion implant buffer film;
    growing a silicon layer by selective epitaxy;
    doping ion impurities on the silicon layer to form a heavily doped layer;
    forming a nitride film having a cutout wider than a gate forming region on the heavily doped layer;
    while using the nude film as an etch mask, etching the heavily doped layer to form source/drain regions;
    forming spacers on the nitride film;
    while using the spacers as an etch mask, etching the LDD region to expose a surface of the substrate;
    forming a gate oxide layer on the exposed surface of the substrate;
    forming a polysilicon layer to cover the nitride film on the gate oxide layer;
    chemical mechanical polishing the polysilicon layer to form a gate;
    forming an interlayer insulating layer on the gate;
    forming contact holes in to interlayer insulating layer exposing portions of upper surfaces of the gate and the source/drain regions; and
    filling the contact holes with conducting material to form conductive plugs.

12. A method as defined in claim 11, wherein the chemical mechanical polishing of the polysilicon layer is performed until the nitride film is exposed and partially etched.

13. A method as defined in claim 11, wherein the nitride film has a thickness of about 1000~2000 Å.

14. A method as defined in claim 11, wherein the silicon layer has a thickness of about 1000~3000 Å.

15. A method as defined in claim 11, wherein the gate oxide layer has a thickness of about 50~200 Å and is formed by oxidation of the substrate.

16. A method as defined in claim 15, wherein the conductive plugs are made of tungsten.

17. A method of manufacturing a semiconductor device comprising;
   forming an LDD region on a semiconductor substrate;
   growing a silicon layer on said LDD region by selective epitaxy;
   doping ion impurities on the silicon layer to form a heavily doped layer;
   forming a nitride film having a cutout wider than a gate forming region on the heavily doped layer;
   etching the heavily doped layer using the nitride film as an etch mask to form source/drain regions; and
   forming a gate in the gate forming region between the source/drain regions.

18. The method of claim 17, wherein the step of forming a gate comprises:
   forming a silicide preventing film on an upper surface of the LDD region and on sides of the source/drain regions;
   forming spacers within the cutout on sidewalls of the nitride film and the silicide preventing film;
   etching the silicide preventing film and the LDD region using the spacers as an etch mask to expose a surface of to substrate;
   forming a gate oxide on the exposed surface of the substrate; and
   forming the gate on the gate oxide layer.

19. The method of claim 18, further comprising:
   removing the spacers and the nitride film; and
   forming silicide layers on the gate and the source/drain regions.

20. The method of claim 19, wherein the step of forming the gate on the gate oxide layer further comprises:
   forming a polysilicon layer on the substrate; and
   etching the polysilicon layer to remove a portion of the polysilicon layer formed outside of the gate forming region.

* * * * *